United States Patent
Rolf et al.

(10) Patent No.: US 11,112,251 B2
(45) Date of Patent: Sep. 7, 2021

(54) METHOD, APPARATUS, AND COMPUTER PROGRAM PRODUCT FOR GENERATING CORRESPONDENCE BETWEEN MAP VERSIONS

(71) Applicant: HERE Global B.V., Eindhoven (NL)

(72) Inventors: Daniel Rolf, Berlin (DE); Raul Cajias, Berlin (DE)

(73) Assignee: HERE GLOBAL B.V., Eindhoven (NL)

(*) Notice: Subject to any disclaimer, the term of this patent is extended or adjusted under 35 U.S.C. 154(b) by 192 days.

(21) Appl. No.: 16/558,631

(22) Filed: Sep. 3, 2019

(65) Prior Publication Data
US 2021/0063166 A1    Mar. 4, 2021

(51) Int. Cl.
| | | |
|---|---|---|
| *G01C 21/30* | (2006.01) | |
| *G06F 16/29* | (2019.01) | |
| *G01C 21/34* | (2006.01) | |
| *H03K 19/21* | (2006.01) | |
| *G08G 1/0968* | (2006.01) | |

(52) U.S. Cl.
CPC ......... *G01C 21/30* (2013.01); *G01C 21/3415* (2013.01); *G01C 21/3461* (2013.01); *G06F 16/29* (2019.01); *H03K 19/21* (2013.01)

(58) Field of Classification Search
CPC ........ G01C 21/30; G01C 21/32; G01C 21/36; G08G 1/0968; G06K 9/00; H03K 19/21
See application file for complete search history.

(56) References Cited

U.S. PATENT DOCUMENTS

| | | |
|---|---|---|
| 8,165,802 B2 | 4/2012 | Ta et al. |
| 8,340,898 B2 | 12/2012 | Currie et al. |
| 8,543,618 B2 | 9/2013 | Fujimoto et al. |

(Continued)

FOREIGN PATENT DOCUMENTS

| | | |
|---|---|---|
| EP | 1096231 A2 | 5/2001 |
| EP | 1102228 A2 | 5/2001 |

(Continued)

OTHER PUBLICATIONS

Link Topology-Geometry Model—HD Live Map Data Specification [online] [retrieved Apr. 17, 2019]. Retrieved via the Internet: https://developer.here.com/olp/documentation/hd-live-map/topics/hdlm2-logical-road-link.htm/ (dated 2018) 2 pages.

(Continued)

*Primary Examiner* — Tan Q Nguyen
(74) *Attorney, Agent, or Firm* — Alston & Bird LLP

(57) ABSTRACT

Provided herein is a method of generating and communicating map version agnostic road identifiers. Methods may include: providing an indication of a route request between an origin and a destination; receiving a list of road link identifiers in response to the route request; in response to the first road link identifier not corresponding to a road link identifier of a network of road link identifiers: applying an XOR function to the first road link identifier and a subsequent road link identifier in the list of road link identifiers; in response to a result of the XOR function applied to the first road link identifier and the subsequent identifier corresponding with a road link identifier of the network of road link identifiers, adding the road link identifier of the network of road link identifiers to the route.

20 Claims, 8 Drawing Sheets

(56) References Cited

U.S. PATENT DOCUMENTS

| | | |
|---|---|---|
| 8,706,391 B2 | 4/2014 | Poppen |
| 8,706,413 B2 | 4/2014 | Gupta |
| 9,219,500 B2 | 12/2015 | Schilling et al. |
| 9,697,426 B2 | 7/2017 | Baselau et al. |
| 9,746,335 B2 | 8/2017 | Kuznetsov |
| 9,909,897 B2 | 3/2018 | Khetan et al. |
| 9,933,269 B2 | 4/2018 | Maischberger et al. |
| 2003/0154019 A1 | 8/2003 | Adachi et al. |
| 2007/0156326 A1* | 7/2007 | Nesbitt .............. G01C 21/3461 701/532 |
| 2007/0198184 A1* | 8/2007 | Yoshioka ............ G09B 29/106 701/426 |
| 2011/0060844 A1 | 3/2011 | Allan et al. |
| 2011/0112760 A1 | 5/2011 | Serbanescu et al. |
| 2012/0209506 A1* | 8/2012 | Tamayama ........... G01C 21/343 701/410 |
| 2016/0223351 A1 | 8/2016 | Sasse et al. |
| 2017/0016730 A1 | 1/2017 | Gawrilow |
| 2017/0314944 A1 | 11/2017 | Konig et al. |
| 2019/0145785 A1* | 5/2019 | Pfeifle ................ G01C 21/3461 701/533 |

FOREIGN PATENT DOCUMENTS

| | | |
|---|---|---|
| EP | 3252431 A1 | 12/2017 |
| WO | WO 2011/160687 A1 | 12/2011 |
| WO | WO 2017/207143 A1 | 12/2017 |
| WO | WO 2019/037959 A1 | 2/2019 |

OTHER PUBLICATIONS

Extended European Search Report for EP Application No. 20194275.2 dated Feb. 8, 2021 (6 pages).

* cited by examiner

METHOD, APPARATUS, AND COMPUTER PROGRAM PRODUCT FOR GENERATING CORRESPONDENCE BETWEEN MAP VERSIONS

TECHNOLOGICAL FIELD

Embodiments described herein generally relate to correlating one or more map elements from a first map version with one or more map elements of a second map version, and more particularly to generating correspondence between map elements without regard for the map versions from which the map elements are derived.

BACKGROUND

Historically paper-based maps were periodically updated in terms of months, years, or longer to account for changes to road infrastructure. Map updates required substantial manual effort and printing of new maps based on the anticipated need. Paper maps have given way to digital maps which can be updated considerably more regularly, and can be of substantially greater detail including all manner of features from roadways to points-of-interest or other features that can be geo-located.

Digital maps can benefit from various data sources such as satellite imagery, crowd-sourced location and image data, crowd-sourced feature/point-of-interest information, municipal databases, map service provider data including sensor-equipped vehicles traveling along road networks, etc. The vast volumes of map-related data can be compiled, filtered, and analyzed to establish map updates and changes. These updates and changes can be implemented with relative ease and can be updated periodically or on-demand based on the latest available data. However, the frequency with which map data may be updated can relegate some digital maps as obsolete or out-of-date relatively quickly. Further, older map versions may be incompatible with newer map versions, particularly when substantial changes exist between the map versions. This problem leads to issues in the exchange of data between one map version and another, such as location data, point-of-interest data, road infrastructure data, or the like.

BRIEF SUMMARY

A method, apparatus, and computer program product are provided in accordance with an example embodiment for identifying correspondences between one or more map elements among different map versions. Embodiments provided herein may include an apparatus having at least one processor and at least one memory including computer program code. The at least one memory and computer program code configured to, with the processor, cause the apparatus to at least: provide an indication of a route request between an origin and a destination; receive a list of road link identifiers in response to the route request; identify a first road link identifier in the list of road link identifiers; in response to the first road link identifier corresponding to a road link identifier of a network of road link identifiers, add the first road link identifier to a route; in response to the first road link identifier not corresponding to a road link identifier of the network of road link identifiers: apply an XOR function to the first road link identifier and a subsequent road link identifier in the list of road link identifiers; in response to the XOR function applied to the first road link identifier and the subsequent identifier corresponding with a road link identifier of the network of road link identifiers, add the road link identifier of the network of road link identifiers to the route; in response to the road link identifiers in the sequential list of road link identifiers corresponding to road link identifiers directly or through the application of the XOR function, establish the route within the network of road links represented by the network of road link identifiers.

The apparatus of an example embodiment may be caused to, in response to the first road link identifier not corresponding to a road link identifier of the network of road link identifiers: apply an XOR function to the first road link identifier and candidate road link identifiers of the network of road link identifiers; in response to the XOR function applied to the first road link identifier and candidate road link identifiers of the network of road link identifiers resulting in a correspondence between a first candidate road link identifier, the first road link identifier, and a second road link identifier, establish correspondence between the first candidate road link identifier and the second candidate road link identifier with the first road link identifier. In response to at least one of the road link identifiers in the sequential list of road link identifiers not corresponding to a road link identifier of the network of road link identifiers directly or through application of the XOR function, the apparatus may be caused to provide a rejection of the sequential list of road link identifiers. An example apparatus may optionally be caused to: provide an indication of a second route request between the origin and the destination, where the second route request includes an instruction to avoid the at least one of the road link identifiers in the list of road link identifiers not corresponding to a road link identifier of the network of road link identifiers directly or through application of the XOR function.

Causing the apparatus to establish the route within the network of road links represented by the network of road link identifiers may include causing the apparatus to provide for route guidance along the route. The route request between the origin and the destination may include a request for the fastest route between the origin and the destination, where the route request may optionally include alternate routes from the fastest route and an indication of a time penalty associated with the alternate routes. Causing the apparatus to establish the route within a network of road links represented by the network of road link identifiers may include causing the apparatus to provide for route guidance along the route and identify the time penalty associated with the alternate routes.

Embodiments provided herein may include a computer program product having at least one non-transitory computer-readable storage medium having computer-executable program code portions stored therein. The computer-executable program code portions including program code instructions configured to: provide an indication of a route request between an origin and a destination; receive a list of road link identifiers in response to the route request; identify a first road link identifier in the list of road link identifiers; in response to the first road link identifier corresponding to a road link identifier of a network of road link identifiers, add the first road link identifier to a route; in response to the first road link identifier not corresponding to a road link identifier of the network of road link identifiers: apply an XOR function to the first road link identifier and a subsequent road link identifier in the list of road link identifiers; in response to a result of the XOR function applied to the first road link identifier and the subsequent identifier corresponding with a road link identifier of the network of road link identifiers, add the road link identifier of the network of road link identifiers to the route; in response to the road link identifiers in the sequential list of road link identifiers corresponding to road link identifiers of the network of road link identifiers directly or through the application of the XOR function, establish the route within a network of road links represented by the network of road link identifiers.

The computer program product of some embodiments may include program code instructions to, in response to the first road link identifier not corresponding to a road link identifier of a network of road link identifiers: apply an XOR function to the first road link identifier and candidate road link identifiers of the network of road link identifiers; in response to the XOR function applied to the first road link identifier and candidate road link identifiers of the network of road link identifiers resulting in a correspondence between a first candidate road link identifier, the first road link identifier, and a second candidate road link identifier, establish correspondence between the first candidate road link identifier and the second candidate road link identifier with the first road link identifier.

The computer program product of some embodiments may further include, in response to at least one of the road link identifiers in the list of road link identifiers not corresponding to a road link identifier of the network of road link identifiers directly or through application of the XOR function, program code instructions to provide a rejection of the list of road link identifiers. Embodiments may optionally include program code instructions to provide an indication of a second route request between the origin and the destination, where the second route request includes an instruction to avoid the at least one of the road link identifiers in the list of road link identifiers not corresponding to a road link identifier of the network of road link identifiers directly or through application of the XOR function. The program code instructions to establish the route within the network of road links represented by the network of road link identifiers may include program code instructions to provide for route guidance along the route. The route request between the origin and the destination may include a request for the fastest route between the origin and the destination, where the route request may further include alternate routes from the fastest route with an indication of a time penalty associated with the alternative routes. The program code instructions to establish the route within the network of road links represented by the network of road link identifiers may include program code instructions to provide for route guidance along the route and identify the time penalty associated with the alternate routes.

Embodiments provided herein may include a method including: providing an indication of a route request between an origin and a destination; receiving a list of road link identifiers in response to the route request; identifying a first road link identifier in the list of road link identifiers; in response to the first road link identifier corresponding to a road link identifier of a network of road link identifiers, adding the first road link identifier to a route; in response to the first road link identifier not corresponding to a road link identifier of a network of road link identifiers: applying an XOR function to the first road link identifier and a subsequent road link identifier in the list of road link identifiers; in response to a result of the XOR function applied to the first road link identifier and the subsequent identifier corresponding with a road link identifier of the network of road link identifiers, adding the road link identifier of the network of road link identifiers to the route; in response to the road link identifiers in the sequential list of road link identifiers corresponding to road link identifiers of the network of road link identifiers directly or through application of the XOR function, establishing the route within a network of road links represented by the network of road link identifiers.

According to some embodiments, in response to the first road link identifier not corresponding to a road link identifier of a network of road link identifiers, methods may include: applying an XOR function to the first road link identifier and candidate road link identifiers of the network of road link identifiers; and in response to the XOR function applied to the first road link and candidate road link identifiers of the network of road link identifiers resulting in a correspondence between a first candidate road link identifier, the first road link identifier, and a second candidate road link identifier, establishing correspondence between the first candidate road link identifier and the second candidate road link identifier with the first road link identifier.

In response to at least one of the road link identifiers in the list of road link identifiers not corresponding to a road link identifier of the network of road link identifiers directly or through the application of the XOR function, providing a rejection of the sequential list of road link identifiers. Methods may include providing an indication of a second route request between the origin and the destination, where the second route request includes an instruction to avoid the at least one of the road link identifiers in the list of road link identifiers not corresponding to a road link identifier of the network of road link identifiers directly or through application of the XOR function. Establishing the route within the network of road links represented by the network of road link identifiers may include providing for route guidance along the route. The route request between the origin and the destination may include a request for the fastest route between the origin and the destination, where the request may further include alternate routes from the fastest route and an indication of a time penalty associated with the alternate routes.

Embodiments provided herein may include an apparatus including: means for providing an indication of a route request between an origin and a destination; means for receiving a list of road link identifiers in response to the route request; means for identifying a first road link identifier in the list of road link identifiers; in response to the first road link identifier corresponding to a road link identifier of a network of road link identifiers, means for adding the first road link identifier to a route; in response to the first road link identifier not corresponding to a road link identifier of a network of road link identifiers: means for applying an XOR function to the first road link identifier and a subsequent road link identifier in the list of road link identifiers; in response to a result of the XOR function applied to the first road link identifier and the subsequent identifier corresponding with a road link identifier of the network of road link identifiers, means for adding the road link identifier of the network of road link identifiers to the route; in response to the road link identifiers in the sequential list of road link identifiers corresponding to road link identifiers of the network of road link identifiers directly or through application of the XOR function, means for establishing the route within a network of road links represented by the network of road link identifiers.

According to some embodiments, in response to the first road link identifier not corresponding to a road link identifier of a network of road link identifiers, an apparatus may include: means for applying an XOR function to the first road link identifier and candidate road link identifiers of the network of road link identifiers; and in response to the XOR function applied to the first road link and candidate road link identifiers of the network of road link identifiers resulting in a correspondence between a first candidate road link identifier, the first road link identifier, and a second candidate road link identifier, means for establishing correspondence between the first candidate road link identifier and the second candidate road link identifier with the first road link identifier.

In response to at least one of the road link identifiers in the list of road link identifiers not corresponding to a road link identifier of the network of road link identifiers directly or through the application of the XOR function, the apparatus may include means for providing a rejection of the sequential list of road link identifiers. An apparatus of some embodiments may include means for providing an indication of a second route request between the origin and the destination, where the second route request includes an instruction to avoid the at least one of the road link identifiers in the list of road link identifiers not corresponding to a road link identifier of the network of road link identifiers directly or through application of the XOR function. The means for establishing the route within the network of road links represented by the network of road link identifiers may include means for providing for route guidance along the route. The route request between the origin and the destination may include a request for the fastest route between the origin and the destination, where the request may further include alternate routes from the fastest route and an indication of a time penalty associated with the alternate routes.

BRIEF DESCRIPTION OF THE DRAWINGS

Figure 1:
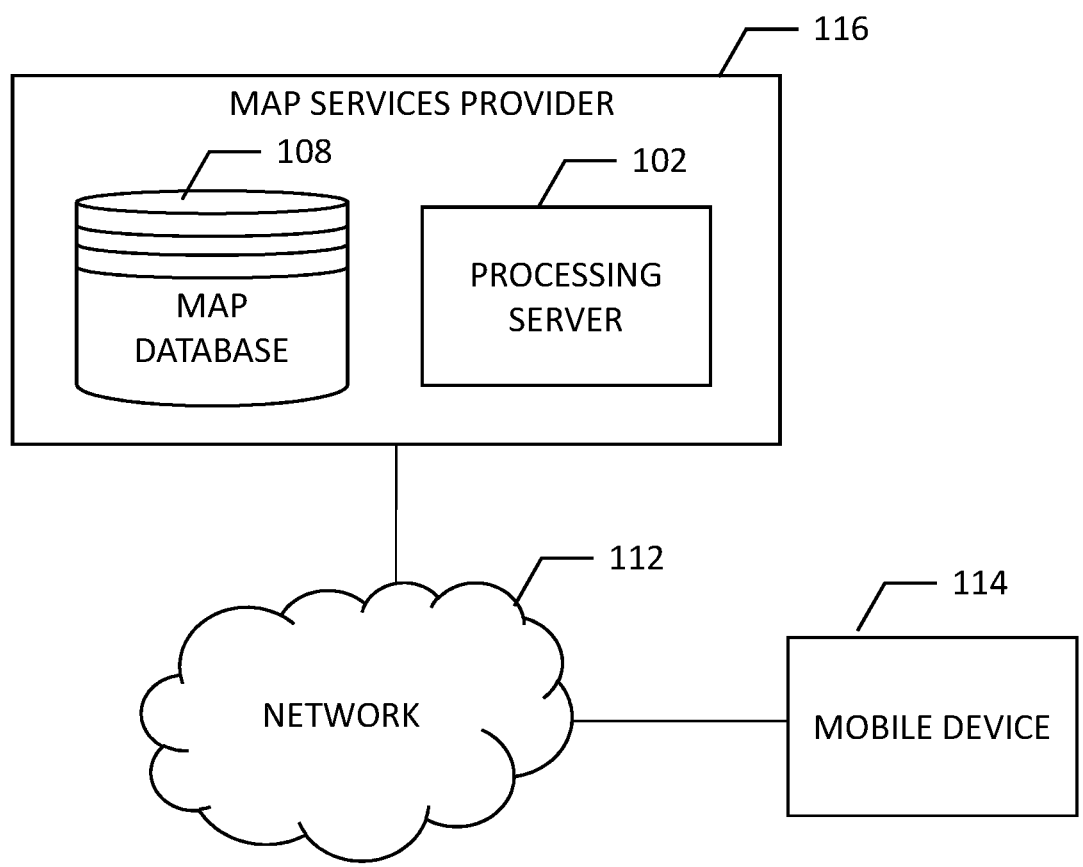
Figure 2:
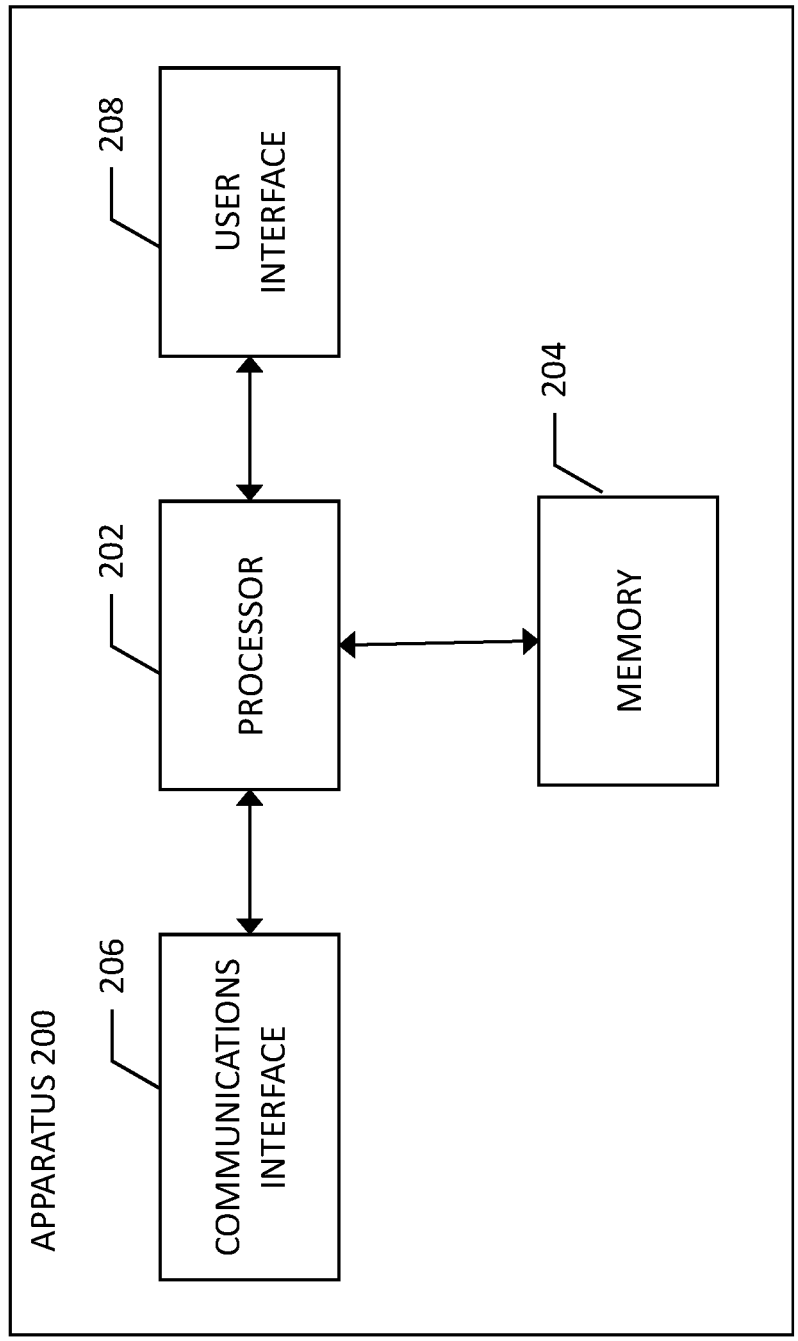
Figure 3:
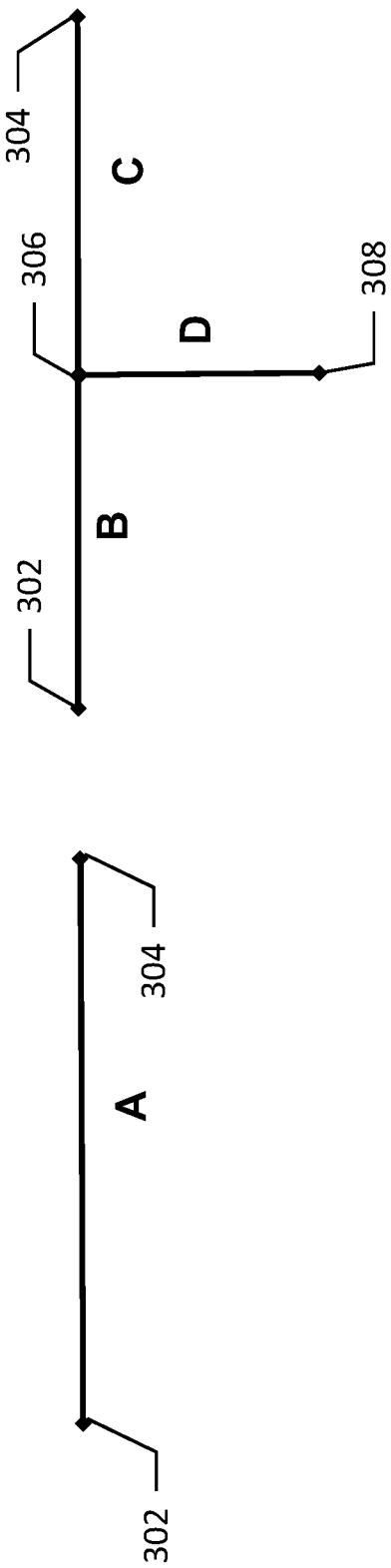
Figure 4:
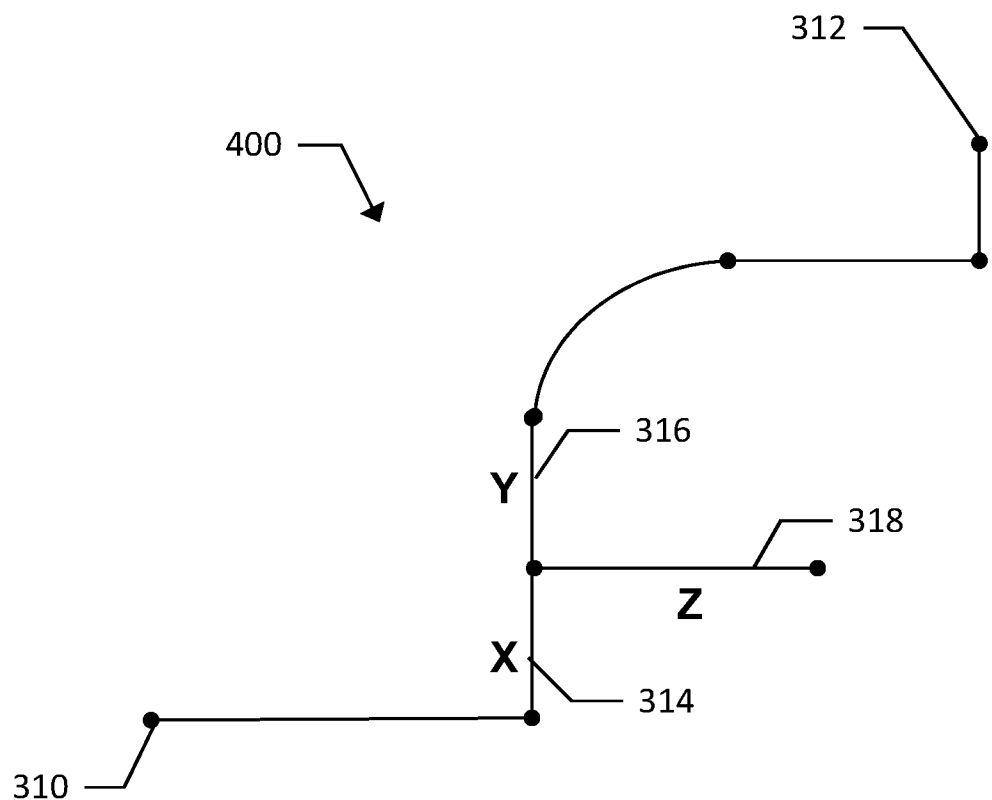
Figure 5:
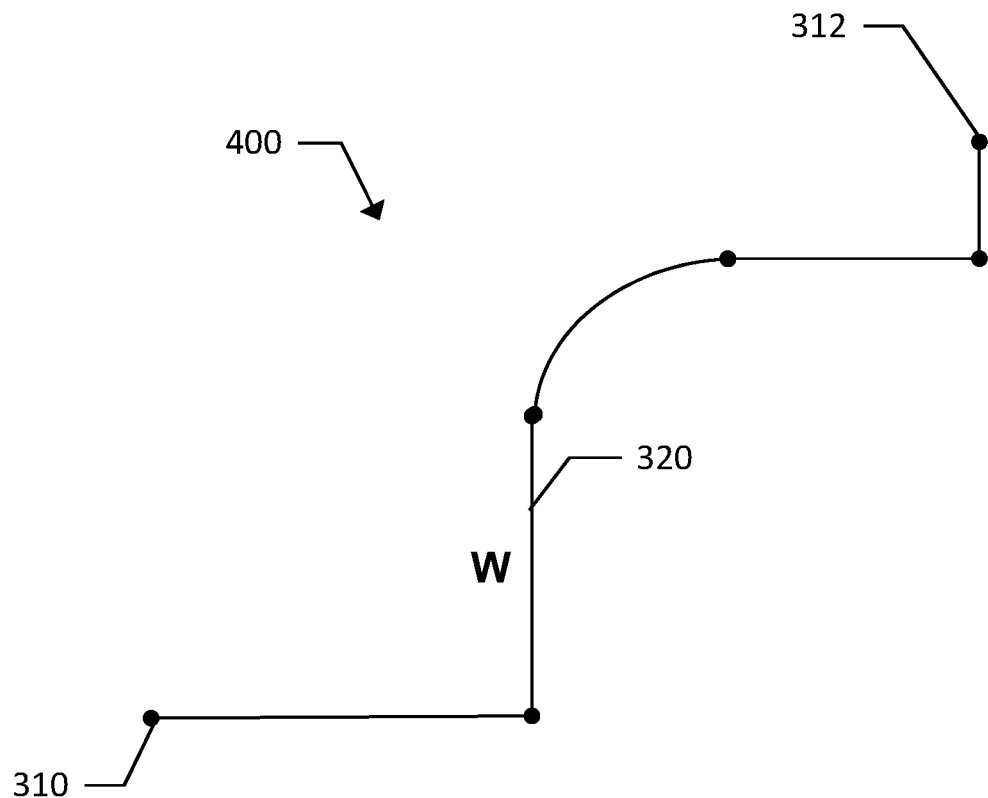
Figure 6:
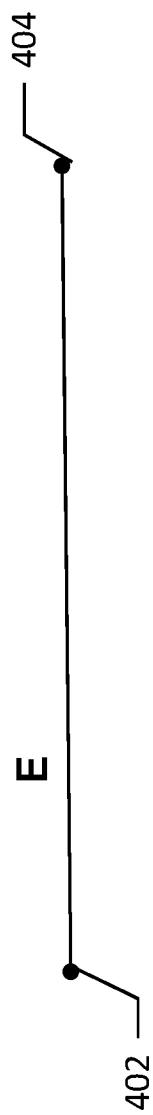
Figure 7:
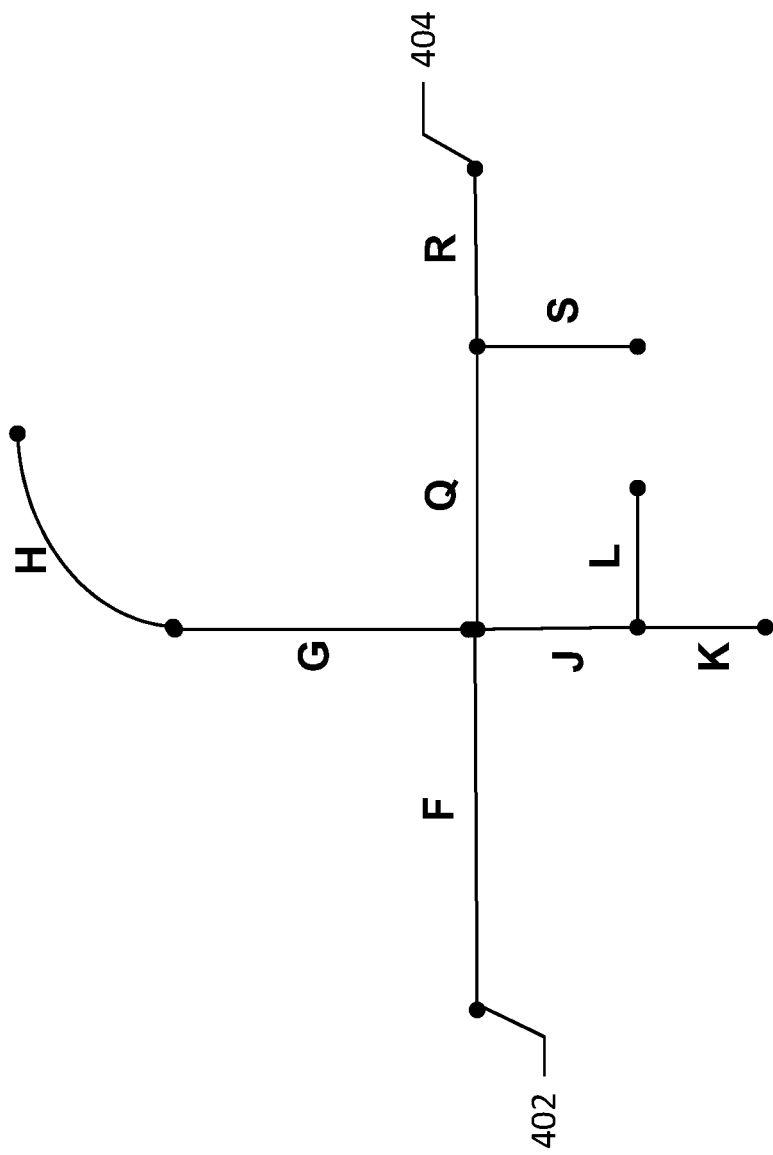
Figure 8:
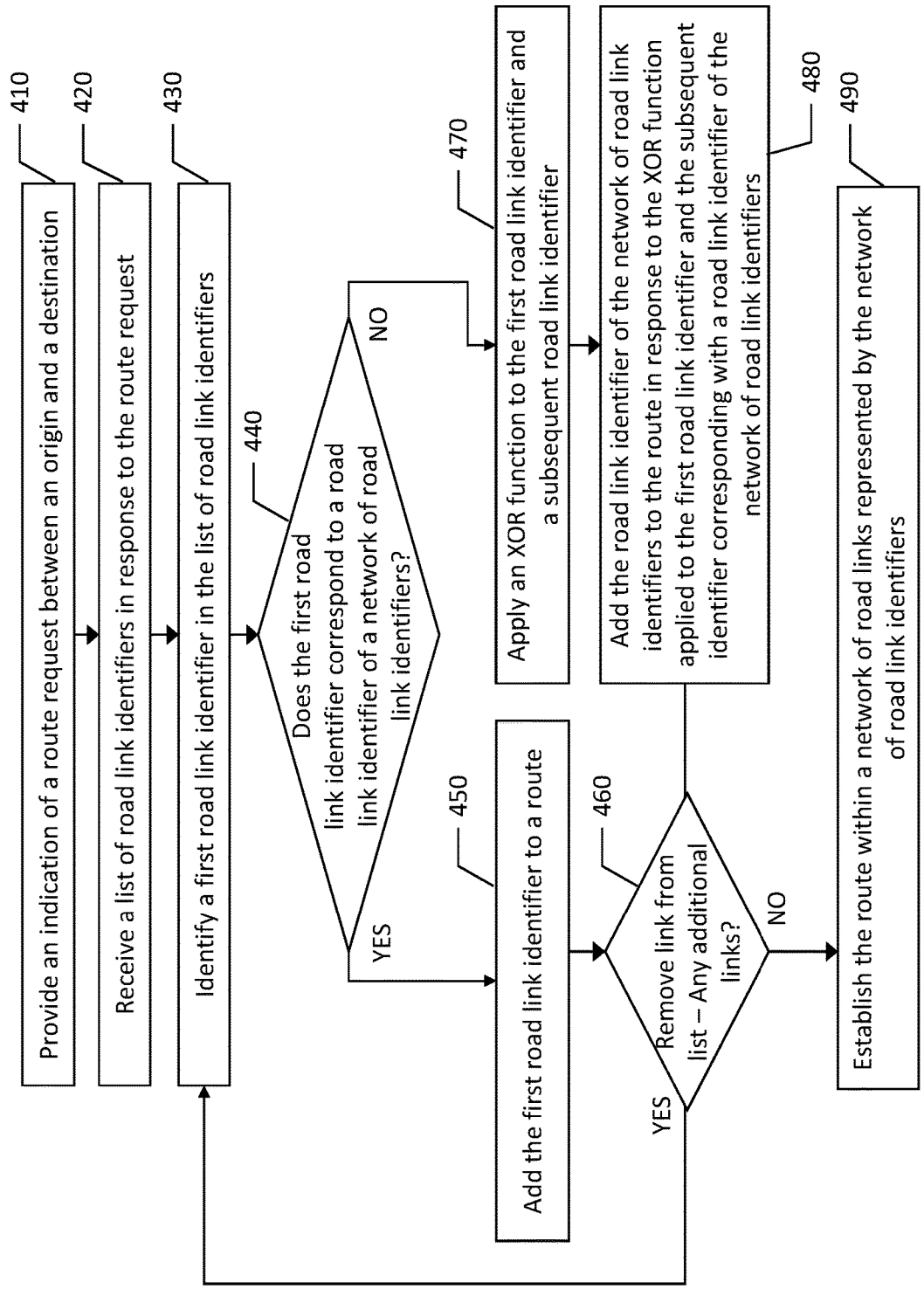

Having thus described example embodiments of the invention in general terms, reference will now be made to the accompanying drawings, which are not necessarily drawn to scale, and wherein:

FIG. 1 illustrates a communications diagram in accordance with an example embodiment of the present disclosure;

FIG. 2 is a block diagram of an apparatus that may be specifically configured for correlating road segment/link identifiers between different versions of a map in accordance with an example embodiment of the present disclosure;

FIG. 3 illustrates a road link split into two road links with the addition of a new road link and node according to an example embodiment of the present disclosure;

FIG. 4 illustrates a road network including road links according to an example embodiment of the present disclosure;

FIG. 5 illustrates the road network of FIG. 4 with a road link and node removed according to an example embodiment of the present disclosure;

FIG. 6 illustrates a road link defined between two end nodes according to an example embodiment of the present disclosure;

FIG. 7 illustrates the road link of FIG. 6 split into three road links according to an example embodiment of the present disclosure; and FIG. 8 is a flowchart of a method for generating a map format agnostic road link identifiers according to an example embodiment of the present disclosure.

DETAILED DESCRIPTION

Some embodiments of the present invention will now be described more fully hereinafter with reference to the accompanying drawings, in which some, but not all, embodiments of the invention are shown. Indeed, various embodiments of the invention may be embodied in many different forms and should not be construed as limited to the embodiments set forth herein; rather, these embodiments are provided so that this disclosure will satisfy applicable legal requirements. Like reference numerals refer to like elements throughout. As used herein, the terms "data," "content," "information," and similar terms may be used interchangeably to refer to data capable of being transmitted, received and/or stored in accordance with embodiments of the present invention. Thus, use of any such terms should not be taken to limit the spirit and scope of embodiments of the present invention.

As defined herein, a "computer-readable storage medium," which refers to a non-transitory physical storage medium (for example, volatile or non-volatile memory device), can be differentiated from a "computer-readable transmission medium," which refers to an electromagnetic signal.

A method, apparatus, and computer program product are provided herein in accordance with an example embodiment for correlating one or more map elements from a first map version with one or more map elements of a second map version to accommodate systems which may have incompatible maps or map versions. Embodiments described herein are uniquely capable of identifying map elements that have changed between map versions and ensuring proper correlation between old map elements and revised map elements in the event that maps and map versions do not have compatible road segment identifiers or other incompatibilities that may otherwise inhibit conventional route communication and navigation.

FIG. 1 illustrates a communication diagram of an example embodiment of a system for implementing example embodiments described herein. The illustrated embodiment of FIG. 1 includes a map services provider system 116, a processing server 102 in data communication a geographic map database, e.g., map database 108 through a network 112, and one or more mobile devices 114. The mobile device 114 may be associated, coupled, or otherwise integrated with a vehicle, such as an in-dash vehicle navigation unit, a vehicle head unit, an electronic control unit, or an advanced driver assistance system (ADAS), or a controller that facilitates autonomous or semi-autonomous driving, for example. Additional, different, or fewer components may be provided. For example, many mobile devices 114 may connect with the network 112. The map services provider 116 may include computer systems and network of a system operator. The processing server 102 may include the map database 108, such as a remote map server. The network may be wired, wireless, or any combination of wired and wireless communication networks, such as cellular, Wi-Fi, internet, local area networks, or the like.

Processing server 102 may be one or more fixed or mobile computing devices. The mobile device 114 may be configured to access the map database 108 via the processing server 102 through, for example, a mapping application, such that the user equipment may provide navigational assistance to a user among other services provided through access to the map services provider 116.

The map database 108 may include node data, road segment/link data, point of interest (POI) data, or the like. The map database 108 may also include cartographic data, routing data, and/or maneuvering data. According to some example embodiments, the road segment/link data records may be links or segments representing roads, streets, or paths, as may be used in calculating a route or recorded route information for determination of one or more personalized routes. The links or roadways may be represented by polylines, where each polyline comprises a plurality of vertices establishing the path of the roadway geometry. The node data may be end points corresponding to the respective links or segments of road segment data. The road link data and the node data may represent a road network, such as used by vehicles, cars, trucks, buses, motorcycles, and/or other entities. Optionally, the map database 108 may contain path segment and node data records or other data that may represent pedestrian paths or areas in addition to or instead of the vehicle road record data, for example. The road links/segments and nodes can be associated with attributes, such as geographic coordinates, street names, address ranges, speed limits, turn restrictions at intersections, and other navigation related attributes, as well as POIs, such as fueling stations, hotels, restaurants, museums, stadiums, offices, auto repair shops, buildings, stores, parks, etc. The map database 108 can include data about the POIs and their respective locations in the POI records. The map database 108 may include data about places, such as cities, towns, or other communities, and other geographic features such as bodies of water, mountain ranges, etc. Such place or feature data can be part of the POI data or can be associated with POIs or POI data records (such as a data point used for displaying or representing a position of a city). In addition, the map database 108 can include event data (e.g., traffic incidents, construction activities, scheduled events, unscheduled events, etc.) associated with the POI data records or other records of the map database 108.

The map database 108 may be maintained by a content provider e.g., a map services provider, and may be periodically updated based on new roads, re-routing of existing roads, changes in points-of-interest, etc. By way of example, the map services provider can collect geographic data to generate and enhance the map database 108. According to some embodiments, the map database 108 may delegate map generation and revision to other devices, such as mobile device 114. There can be different ways used by the map services provider to collect data. These ways can include obtaining data from other sources, such as municipalities or respective geographic authorities. In addition, the map services provider can employ field personnel to travel by vehicle along roads throughout the geographic region to observe features and/or record information about them, for example. Also, remote sensing, such as aerial or satellite photography, can be used to generate map geometries directly or through machine learning as described herein. The map data gathered from among various sources may be compiled into map updates that may take place periodically or as needed, resulting in a dynamic map database 108 that is routinely changed and updated to reflect the most accurate representation of the roads and features of a region.

The map database 108 may be a master map database stored in a format that facilitates updating, maintenance, and development. For example, the master map database or data in the master map database can be in an Oracle spatial format or other spatial format, such as for development or production purposes. The Oracle spatial format or development/production database can be compiled into a delivery format, such as a geographic data files (GDF) format. The data in the production and/or delivery formats can be compiled or further compiled to form geographic database products or databases, which can be used in end user navigation devices or systems.

For example, geographic data may be compiled (such as into a platform specification format (PSF)) to organize and/or configure the data for performing navigation-related functions and/or services, such as route calculation, route guidance, map display, speed calculation, distance and travel time functions, and other functions, by a navigation device, such as by mobile device 114, for example. The navigation-related functions can correspond to vehicle navigation, pedestrian navigation, or other types of navigation. While example embodiments described herein generally relate to vehicular travel along roads, example embodiments may be implemented for pedestrian travel along walkways, bicycle travel along bike paths, boat travel along maritime navigational routes, etc. The compilation to produce the end user databases can be performed by a party or entity separate from the map services provider. For example, a customer of the map services provider, such as a navigation device developer or other end user device developer, can perform compilation on a received map database in a delivery format to produce one or more compiled navigation databases.

As mentioned above, the server side map database 108 may be a master geographic database, but in alternate embodiments, a client side map database 108 may represent a compiled navigation database that may be used in or with end user devices (e.g., mobile device 114) to provide navigation and/or map-related functions. For example, the map database 108 may be used with the mobile device 114 to provide an end user with navigation features. In such a case, the map database 108 can be downloaded or stored on the end user device (mobile device 114) which can access the map database 108 through a wireless or wired connection, such as via a processing server 102 and/or the network 112, for example. Optionally, a portion of the map database 108, such as map data regarding a specific roadway, may be downloaded or stored temporarily on an end user device, and according to various embodiments described herein, the mobile device 114 may be configured to modify the map data regarding a roadway before sending the map data back to the map database 108.

According to some embodiments, a server side map database 108 and a client side map database may be different. For example, even when the map data of both map databases is from the same map services provider 116, the map data may differ from server side to client side. This may be due to different map versions existing and being updated at different periodic rates. Further, client map data and server map data may differ when the map data originates from different sources. Different map data and map versions between a client and a server may be problematic when routing services are required by the mobile device 114 and provided by the map services provider 116. Road links that are identified by unique identifiers in a server side map database 108 may be incompatible with identifiers or road links of a client side map database. As such, embodiments provided herein use an identifier-independent protocol to provide a server side generated route to a client.

In one embodiment, the mobile device 114 can be an in-vehicle navigation system, such as an ADAS, a personal navigation device (PND), a portable navigation device, a cellular telephone, a smart phone, a personal digital assistant (PDA), a watch, a camera, a computer, and/or other device that can perform navigation-related functions, such as digital routing and map display. A mobile device is provided for navigation and map functions such as guidance and map display, for example, and for determination of one or more personalized routes or route segments based on one or more calculated and recorded routes, according to some example embodiments.

The processing server 102 may receive probe data from a mobile device 114 or a device in communication with mobile device 114. The mobile device 114 may include one or more detectors or sensors as a positioning system built or embedded into or within the mobile device 114. Alternatively, the mobile device 114 uses communications signals for position determination. The mobile device 114 may receive location data from a positioning system, such as a global positioning system (GPS), cellular tower location methods, access point communication fingerprinting, or the like. The server 102 may receive sensor data configured to describe a position of a mobile device, or a processor of the mobile device 114 may receive the sensor data from the positioning system of the mobile device 114. The mobile device 114 may also include a system for tracking mobile device movement, such as rotation, velocity, or acceleration. Movement information may also be determined using the positioning system. The mobile device 114 may use detectors and sensors to provide data indicating a location of a vehicle. This vehicle data, also referred to herein as "probe data", may be collected by any device capable of determining the necessary information, and providing the necessary information to a remote entity. The mobile device 114 is one example of a device that can function as a probe to collect probe data of a vehicle.

More specifically, probe data (e.g., collected by mobile device 114) is representative of the location of a vehicle at a respective point in time and may be collected while a vehicle is traveling along a route. While probe data is described herein as being vehicle probe data, example embodiments may be implemented with pedestrian probe data, marine vehicle probe data, or non-motorized vehicle probe data (e.g., from bicycles, skate boards, horseback, etc.). According to the example embodiment described below with the probe data being from motorized vehicles traveling along roadways, the probe data may include, without limitation, location data, (e.g. a latitudinal and longitudinal position, and/or height, GPS coordinates, wireless network positioning, such as Wi-Fi Bluetooth™ positioning, proximity readings associated with a radio frequency identification (RFID) tag, or the like), rate of travel, (e.g. speed), direction of travel, (e.g. heading, cardinal direction, or the like), device identifier, (e.g. vehicle identifier, user identifier, or the like), a time stamp associated with the data collection, or the like. The mobile device 114, may be any device capable of collecting the aforementioned probe data. Some examples of the mobile device 114 may include specialized vehicle mapping equipment, navigational systems, mobile devices, such as phones or personal data assistants, or the like. Probe data collected by a mobile device 114 may be error prone, where probe data location information may not correspond precisely with the actual physical location of the probe. For example, probes traveling through urban canyons, forests, or actual canyons may have probe data point locations that are very noisy in that they do not correspond well with the actual location of the probe due to signal noise and issues with locationing means for detecting the location of the probe.

An example embodiment of a processing server 102 may be embodied in an apparatus as illustrated in FIG. 2. The apparatus, such as that shown in FIG. 2, may be specifically configured in accordance with an example embodiment of the present invention for connecting server generated routes along road segments between an origin and a destination to client device map data, even when the server side map data differs from the client side map data. The apparatus may include or otherwise be in communication with a processor 202, a memory device 204, a communication interface 206, and a user interface 208. In some embodiments, the processor (and/or co-processors or any other processing circuitry assisting or otherwise associated with the processor) may be in communication with the memory device via a bus for passing information among components of the apparatus. The memory device may be non-transitory and may include, for example, one or more volatile and/or non-volatile memories. In other words, for example, the memory device may be an electronic storage device (for example, a computer readable storage medium) comprising gates configured to store data (for example, bits) that may be retrievable by a machine (for example, a computing device like the processor 202). The memory device may be configured to store information, data, content, applications, instructions, or the like, for enabling the apparatus to carry out various functions in accordance with an example embodiment of the present invention. For example, the memory device could be configured to buffer input data for processing by the processor. Additionally or alternatively, the memory device could be configured to store instructions for execution by the processor.

The processor 202 may be embodied in a number of different ways. For example, the processor may be embodied as one or more of various hardware processing means such as a coprocessor, a microprocessor, a controller, a digital signal processor (DSP), a processing element with or without an accompanying DSP, or various other processing circuitry including integrated circuits such as, for example, an ASIC (application specific integrated circuit), an FPGA (field programmable gate array), a microcontroller unit (MCU), a hardware accelerator, a special-purpose computer chip, or the like. As such, in some embodiments, the processor may include one or more processing cores configured to perform independently. A multi-core processor may enable multiprocessing within a single physical package. Additionally or alternatively, the processor may include one or more processors configured in tandem via the bus to enable independent execution of instructions, pipelining and/or multithreading.

In an example embodiment, the processor 202 may be configured to execute instructions stored in the memory device 204 or otherwise accessible to the processor. Alternatively or additionally, the processor may be configured to execute hard coded functionality. As such, whether configured by hardware or software methods, or by a combination thereof, the processor may represent an entity (for example, physically embodied in circuitry) capable of performing operations according to an embodiment of the present invention while configured accordingly. Thus, for example, when the processor is embodied as an ASIC, FPGA or the like, the processor may be specifically configured hardware for conducting the operations described herein. Alternatively, as another example, when the processor is embodied as an executor of software instructions, the instructions may specifically configure the processor to perform the algorithms and/or operations described herein when the instructions are executed. However, in some cases, the processor may be a processor specific device (for example, a mobile terminal or a fixed computing device) configured to employ an embodiment of the present invention by further configuration of the processor by instructions for performing the algorithms and/or operations described herein. The processor may include, among other things, a clock, an arithmetic logic unit (ALU) and logic gates configured to support operation of the processor.

The apparatus 200 of an example embodiment may also include a communication interface 206 that may be any means such as a device or circuitry embodied in either hardware or a combination of hardware and software that is configured to receive and/or transmit data to/from a communications device in communication with the apparatus, such as to facilitate communications with one or more mobile devices 114 or the like. In this regard, the communication interface may include, for example, an antenna (or multiple antennae) and supporting hardware and/or software for enabling communications with a wireless communication network. Additionally or alternatively, the communication interface may include the circuitry for interacting with the antenna(s) to cause transmission of signals via the antenna(s) or to handle receipt of signals received via the antenna(s). In some environments, the communication interface may alternatively or also support wired communication. As such, for example, the communication interface may include a communication modem and/or other hardware and/or software for supporting communication via cable, digital subscriber line (DSL), universal serial bus (USB) or other mechanisms.

The apparatus 200 may also include a user interface 208 that may, in turn, be in communication with the processor 202 to provide output to the user and, in some embodiments, to receive an indication of a user input. As such, the user interface may include a display and, in some embodiments, may also include a keyboard, a mouse, a joystick, a touch screen, touch areas, soft keys, one or more microphones, a plurality of speakers, or other input/output mechanisms. In one embodiment, the processor may comprise user interface circuitry configured to control at least some functions of one or more user interface elements such as a display and, in some embodiments, a plurality of speakers, a ringer, one or more microphones and/or the like. The processor and/or user interface circuitry comprising the processor may be configured to control one or more functions of one or more user interface elements through computer program instructions (for example, software and/or firmware) stored on a memory accessible to the processor (for example, memory device 204, and/or the like).

Example embodiments of the present invention may provide a mechanism for identifying road links between two different map versions that may have different link identifiers in order to identify routes, addresses, traffic, or other information from a first system to a second system, operating with different map versions. According to an example embodiment, map information, such as paths of roadways, direction of traffic on said roadways, intersections, and the like may be stored, for example, on a server-side map database 108. As roadway infrastructure is subject to deterioration over time, road construction on existing roadways is an inevitable event that will alter roadways at least temporarily. Further, increases in population and vehicular traffic result in the need for new or expanded roadways, while other roadways may be removed or replaced. The term "roadways," as used herein, may refer to any path a vehicle may take in moving from one place to another. Roadways may be paved, improved roadways, gravel roadways, dirt trails, or the like, such that roadways does not imply that the mapped roads are necessarily recognized as county, state, or federally maintained roads, and may include private roadways such as access roads, neighborhood streets, and the like. As these roadways may change over the course of time, map information related to these roadways may require revision to keep up with the changes to the roadway paths. Additional map update triggers may include changes associated with roadways such as speed limits changing on a road, which may also prompt segmentation of a road link resulting in new road links with new road link identifiers, for example.

The server-side map database 108 may identify road links by road link identifiers used to uniquely identify road links, where a sequence of identified road segments may be used as a route between an origin and a destination. However, client-side map data may not be as up to date as server-side map data. Client-side map data may be map data that is provided with a navigation system or application, and may not receive the periodic updates afforded a server-side map database 108. Consequently, the client map data may not match the server-side map data, and the unique identifiers used to identify road links in the server-side map data may not correspond to unique identifiers of corresponding road links in client map data. Further, roads may change through new construction, through the addition or demolition or roadways, through re-routing of roadways and traffic patterns, or the like. Thus, a route generated by a server-side map service provider 116 may reference road links through unique identifiers that do not correspond to an equivalent route on the client-side map data.

While example embodiments described herein generally relate to correlating road links between a server and a client for route guidance purposes, the correlation of road links between two different systems may be performed for a variety of reasons. For example, a server may communicate information about a geographic region to a client, such as traffic events, road closures, or other factor that may be of interest to a user. In communicating this information, the server may identify a road link along which an event is occurring or for which information is available. The client may have a different map version such that it is important to properly translate the road link identification between map versions. Thus, correlating of road links between map versions can be performed for any of a variety of reasons. Further, while example embodiments described herein may primarily relate to server-side and client-side map versions and conversion, embodiments may be employed between client devices, such as two users communicating between each other to identify a road segment, for example.

Example embodiments described herein provide a mechanism to reliably and repeatably correlate road links between different map versions. According to an example embodiment, in order for a client side device to properly receive, interpret, and present route guidance or navigation generated by a server-side map services provider 116, the server and the client need to be able to correlate road links between a server-side map version and a client-side map version for information, such as a route to a destination, that is computed on the server-side may be transferred to the client and properly understood/translated. The unique identifiers of map road segments/links used to describe a sequence of road links in a route or the unique identifiers of map road links used to provide information to a user must match in the same map data and version for conventional route transfer between servers and clients. However, example embodiments described herein may correlate road links between two different map versions to enable communication of road link related information (e.g., route guidance, point of interest information, etc.) between two different map versions even when road link identifiers do not match.

If, for example, a map service provider maintains map support for four years, and releases a new map update/version every quarter, and has four different map format versions used in the field, the map service provider would need to keep four quarters (4) of four years (4) for four map formats (4) for a total of 64 map versions that would have to be simultaneously maintained on servers to anticipate that some device having any of the 64 variants may request a route from the map services provider. This approach does not scale for rapid refresh (e.g., weekly/daily releases) as illustrated due to the unsustainable growth of map variants that would need to be maintained. The more map variants needed results in greater memory consumption and lower processing performance. Embodiments described herein define a route and the workflow between a client and server that is based on retracing the route between via points of a route and verifying fingerprints of the fragments of the route, thereby avoiding the need to have identical versions of a map between a server and a client.

Embodiments described herein define a scheme of a map services provider 116, such as in map editing software executed by the processing server 102 or during map compilation that generates map element (e.g., road segment or link) identifiers in such a way that the identifiers clearly relate between corresponding map elements between two different map versions. Embodiments described herein may be employed for all graph representations of the real world. However, conventional stable topology links for two-dimensional maps may be used to represent the road network. The two-dimensional map may be modeled as nodes and links. Links span between nodes and nodes connect one or more links. The degree of a node is the number of links it connects. A node is referred to as bi-valent if it connects exactly two links. A mono-valent node is an end point of a road, such as a dead end or a cul-de-sac. A map as defined herein may be a stable topology map if it does not contain any bi-valent nodes. The links are then considered stable topology links. Stable topology links are generally stable as they typically only change when new roads are built.

FIG. 3 illustrates an example embodiment of link identifiers changing in response to a change in the stable topology map. As shown, link A is a single link between two end nodes 302 and 304. A new road, link D, is constructed and added to the topology joining former link A at new node 306. The node 306 is required as any intersection between roads is at a node. The insertion of new node 306 breaks link A into two segments, link B and link C. Link B and link C are each assigned a new identifier, different from link A from which they were formed. This change can be problematic for conventional map systems. Two different versions of a map may differ in the nodes and link identifiers. One version of a map may include link A, while another version of the map includes new link D and consequently links B and C instead of link A. Conventional map software may not be able to resolve the differences due to the differing link identifiers. For example, if a route generated from the new version of the map including link B and link C, a navigation system of a vehicle employing the old version of the map may not be able to find links B and C on their map such that the route is not understood and rejected by the navigation system. Embodiments described herein resolve this issue by enabling correlation between versions of a map to identify links B and C from link A to make compatible the map versions.

Embodiments described herein employ an XOR function or XOR logic gate. The XOR function is a logic gate that gives a "true" output when the number of true inputs is odd. The XOR function, sometimes called the "Exclusive OR", provides a "true" output if one and only one of the inputs to the function is true. The XOR function represents an inequality function where the output is true if the inputs are not alike, otherwise the output is false. XOR provides a true output when for a logic issue where one or the other of two inputs is true, but not both. An n-bit XOR function is made from n gates. For instance, the statement $x\_1$ XOR $x\_2$ would mean an XOR between the first bit and the second bit of ID=x. Bit-wise XOR involves where corresponding bits from two identifiers (e.g., 6-bit identifiers) are logically XOR'd to form a corresponding bit in a third identifier. An example may include 6-bit identifiers including identifier A=011101 and identifier B=001011. The XOR identifier applied to identifiers A and B would result in identifier C=010110, where a zero is present when the XOR is false (bits are equal) and a one is present where the XOR is true (bits are not equal).

According to example embodiments described herein, $XOR(x\_1, \ldots, x\_n)$ denotes the sequentially applied bitwise XOR function, otherwise represented as $x\_1$ XOR ... XOR $x\_n$. The XOR function is associative with the possibility of arbitrary grouping. As an example:

$$\text{If } z = x \text{ XOR } y, \text{ then } x \text{ XOR}(y \text{ XOR } z) = (x \text{ XOR } y) \text{XOR } Z \quad (1)$$

The XOR function is applied herein to correlate link identifiers between different map versions enabling the translation of a map identifier of one version of a map to a different identifier or plurality of identifiers in another version of the map. According to an example embodiment, 128-bit or 64-bit link identifiers may be used. Referring to the example illustration of FIG. 3, link A has a 128-bit number identifier assigned thereto. When a new link is added to the map and intersects link A, as shown by link D intersecting former link A at node 306, links B, C, and D each require new unique 128-bit numerical identifiers. Link A from a prior version of the map is split into links B and C in the new version of the map due to the addition of new link D. A random 128-bit number identifier may be assigned to link D as the numerical identifier represented as ID_D, and a random 128-bit number identifier may be assigned to link B represented as ID_B. Original link A has a numerical identifier represented as ID_A.

According to example embodiments described herein, the numerical identifier for link C is set to ID_C=XOR(ID_A, ID_B). Link B is assigned identifier ID_B and link C is assigned identifier ID_C based on the above. Since ID_A was chosen as a random number when link A was created, and ID_B is a random number, ID_C can also be treated as a random number. The risk of collision among these random numbers for a 128-bit identifier, or even among 64-bit identifiers is low. For the 128-bit identifier case, assuming the creation of 2^32 (4 billion) new links per year, which is unrealistically high, after 128 years, 2^39 new links will have been created. The risk of two identifiers being the same during that time is roughly one in 2*10^15. An infinitesimally small risk that is highly unlikely to occur. While 128-bit and 64-bit identifiers are described above, shorter identifiers may be used, particularly when a global map is segmented and identifiers could be duplicated between different segments.

Due to the properties of the XOR function, the ID_C=XOR(ID_A, ID_B) also implies that ID_A=XOR (ID_B, ID_C) based on the associate property. Hence, there is a clear relationship between the old link identifier for link A (ID_A) and new link identifiers for links B and C (ID_B and ID_C, respectively). Thus, if a path references an identifier from the old map (ID_A) that cannot be found in the new map, a system only has to check whether there are two identifiers (ID_1 and ID_2) of two adjacent links in the new map with ID=XOR(ID_1, ID_2). This way, paths from the old version with links having been split can be uniquely and safely mapped to the new version.

An example embodiment will be described herein with respect to a route 400 calculated between an origin and a destination along a plurality of road segments or links by a map services provider 116 using the most recent, up-to-date map available. FIG. 4 illustrates a route between an origin at node 310 and a destination at node 312. The origin and destination do not need to be at a node and can be along a road link; however the origin and destination are shown as nodes for ease of illustration. The illustrated route of FIG. 4 includes road links from the origin to the destination, including road links 314 having link identifier ID_X and link 316 having link identifier ID_Y. Link 318 with link identifier ID_Z is illustrated as being a recently added road link, not present in a prior version of the map. FIG. 5 provides an indication of the road links of FIG. 4 in a prior version of the map, which may be maintained at a navigation device of a user. In response to the user requesting a route between the origin and the destination, the route may be provided including links 314 and 316 (ID_X and ID_Y, respectively). The route may be provided to the user in the form of a sequence of link identifiers for the navigation system to correlate to the map to provide route guidance to the user. However, the links 314 and 316 do not exist in the map version of the navigation device, such that the route does not correspond to the map of the navigation device and cannot be generated without embodiments described herein.

The navigation device of example embodiments, which may be illustrated as apparatus 200 including processor 202, may recognize that the route provided by the map services provider 116 includes links not corresponding to links of the navigation device map. In response, the navigation device may analyze combinations of links using methods described herein to determine if any existing links of the old version of the map correspond to new links of the new map version. The process may begin at the first link not recognized by the navigation device. In the illustrated embodiment, road link 314 having identifier ID_X is not found in the map of the navigation device. The navigation device may then take combinations of consecutive links using the XOR function to establish correspondence. In the illustrated embodiment, the navigation device, embodied by apparatus 200 using processor 202, may set ID_X equal to XOR (ID_W, ID_Y). Link 320 having identifier ID_W is selected as it is the road link emanating from the last node that corresponded to the route provided by map services provider 116. Link 316 having identifier ID_Y is selected as it is a road link continuous with link 314 having identifier ID_X. The function ID_X=XOR(ID_W, ID_Y) would return a true response, as link 320 having identifier ID_W was broken into link 314 having identifier ID_X and link 316 having identifier ID_Y.

While the correct link correspondence was found through the above-described embodiment, embodiments would also consider if link 320 having identifier ID_W corresponds to link 314 having identifier ID_X and link 318 having identifier ID_Z. This is because Link 320 having identifier ID_W is selected as it is the road link emanating from the last node that corresponded to the route provided by map services provider 116. Link 318 having identifier ID_Z is selected as it is a road link continuous with link 314 having identifier ID_X. The function ID_X=XOR(ID_W, ID_Z) would return a false response response, as link 320 having identifier ID_W was not broken into link 314 having identifier ID_X and link 318 having identifier ID_Z.

While the aforementioned embodiments pertain to road links being split or broken into smaller road links, embodiments may also include road links that merge, such as where a road is removed from an intersection. Referring back to FIG. 3, the original map may include road links having identifiers ID_B, ID_C, and ID_D. The new map may include instead road link having identifier ID_A. In this case, the identifier for the road link between node 302 and node 304 may be generated. In the new version of the map, ID_A is set equal to XOR (ID_B, ID_C), and ID_A is assigned to the link between node 302 and node 304.

Embodiments described herein provide a clear relationship between the old road link identifiers and the new road link identifiers between map versions. Thus, if a path references two consecutive identifiers ID_1 and ID_2 from an old map that cannot be found in the new map, a user may then check whether the new map contains a link identifier that satisfies XOR(ID_1, ID_2). In this manner, paths from the old version of the map are uniquely and safely mapped to the merged link of a revised map.

Embodiments provided herein generate link identifiers under common map editing operations that can be integrated into map editing software. The link identifiers can either fully substitute existing identifier schemes or added as an attribute to the links to avoid drastic changes. Employing methods described above enable the generation of these identifiers after the fact by comparing maps such that instead of extending map editing, it can be done during compilation of raw map data to target formats. For example, embodiments could be carried as an additional attribute in various map formats such High Definition (HD) maps, Navigational Data Standard (NDS) maps, RDF mapping language, etc.

Embodiments described herein provide for the preservation of properties on longer chains of links. Given an acrylic path as a sequence of identifiers ID_1, ... , ID_N in one map version and the corresponding sequence of identifiers ID'_1, ... ID'_M in another map version, it holds that XOR (ID_1, ... , ID_N)=XOR (ID'_1, ... ID'_M). As such, the same path can be uniquely identified across all map versions by applying the XOR function to all of the maps link IDs.

While the aforementioned examples have been relatively simplistic for ease of understanding, embodiments may be extrapolated to include considerably more road link options in establishing correspondence between an old map version and a new map version. FIG. 6 illustrates an extrapolated example embodiment in which road link having identifier ID_E extends between nodes 402 and 404 in an old map version. This section of a map may be in a suburban area where new residential developments are being constructed, such that a new map version is illustrated in FIG. 7. For road link having identifier ID_E to find the corresponding combination of links, numerous permutations may be attempted using the XOR function.

ID_E=XOR (ID_F, ID_Q): FALSE
ID_E=XOR (ID_F, ID_J): FALSE
ID_E=XOR (ID_F, ID_G): FALSE
ID_E=XOR (ID_FG, ID_H): FALSE
ID_E=XOR (ID_FJ, ID_K): FALSE
ID_E=XOR (ID_FJ, ID_L): FALSE
ID_E=XOR (ID_FQ, ID_S): FALSE
ID_E=XOR (ID_FQ, ID_R): TRUE

The consecutive links may be concatenated as the search for the correspondence progresses along a path and adds links, as shown by ID_FQ which corresponds to links having identifiers ID_F and ID_Q. As shown, the XOR function can be used to crawl along a series of consecutive links to establish the correspondence between links. This crawling can be limited to a predetermined number of combinations or degrees of progression (e.g., how many consecutive links to attempt to combine) before indicating that the attempt has failed.

Resolving Routes Between Different Map Versions

Networks of roads in a region may include a plurality of road segments or road links that join together to form the road network. Each of the road segments may include a reference point or "midpoint", which may be proximate the middle of a length of the road segment. Routes include a plurality of road segments in a sequence between an origin and a destination, while route fragments include groups of road segments along the route between intermediate road segments of the route. For example, a route may include road segments A, B, C, D, and E. With A being a starting road segment along which an origin is located, and E being a target road segment along which a destination is located.

According to example embodiments described herein, the server based map services provider 116 may use only a single variant of map data in the map database 108, thereby maintaining only a latest, most recent and accurate map. The client, such as mobile device 114 may be a pre-installed, potentially outdated map. For example, the mobile device may be embodied as a navigation system in a vehicle, where the map data on the mobile device may be installed at the time of vehicle assembly, and therefore may be stagnant and subject to becoming outdated. Using map-matching techniques, the mobile device 114 may identify a "START_SEGMENT" as the road segment in the outdated map on which the vehicle associated with the mobile device 114 is located. A "TARGET_SEGMENT" is a road segment identified by a user in the outdated map of the mobile device 114 as a destination to reach. This destination may be determined by geocoding of a target address, for example.

Server-Side Route Computation and Encoding

In order to generate a server-side route, specific data points of a road network may be defined, whether on the outdated map variant or a current version of a map. A midpoint of a road segment may be a coordinate of a point that is at or proximate the halfway point of the road segment. For example, a midpoint of a road segment that extends between two intersections or nodes and is a half-mile long may be a quarter mile from each intersection or node. An elevation may optionally be defined as a "z-level" of a road segment. The "z-level" or elevation of a road segment may typically be zero, though a road segment in a tunnel may have a negative z-level while stacked roads in bridges and interchanges may have a positive z-level. The z-level elevation describes the relative location of road segments in a vertical direction orthogonal to the ground. A hash function may be used by embodiments described herein. The hash function can be any ash function (e.g., MD5, SHA), though the same hash function will be used on both the server side and the client side of the route encoding and decoding processes.

The client (e.g., mobile device 114) may send a routing request to the server by encoding a start point. The start point may be encoded as the midpoint+z-level of the current road segment or "START_SEGMENT" of the mobile device 114. The destination may be encoded as the midpoint+z-level of the "TARGET_SEGMENT". The client may also send the XOR-Stable identifiers of the START_SEGMENT and the TARGET_SEGMENT. The XOR-Stable identifiers may be identifiers of road links within the map version of the client which have been processed as described above for road updates using the XOR function such that future updates to the map data may be properly correlated to prior iterations of map data.

Based on the provided origin (START) and destination (TARGET), the server (e.g., map services provider 116) may find the appropriate segments in the latest map version. The server may process the input data with a tolerance, such as a few meters, by which an error of the midpoint provided by a client may differ from a corresponding midpoint identified by the server. Further, the z-level may be used for clarifying or "tie-breaking" the selected road segment in the event tunnels, bridges, or interchanges are located along the road segment identified by the midpoint. Optionally, the server may use the XOR-Stable identifiers of the START_SEGMENT and the TARGET_SEGMENT to find the proper links if there are multiple candidates for the START and TARGET.

If a map services provider cannot exactly match the START to its map, a warning will be flagged in a response to the client. In such a scenario, the user may be warned that they need to move locations (e.g., progress along a road segment or reach a new road segment) as the user is in an undefined location. Similarly, if a TARGET is not properly identified by the map services provider, a warning may be provided to a user that the TARGET is not reachable according to current map data and a revised TARGET destination should be selected.

Once a START and TARGET location are adequately identified by the server, a route may be generated using the latest map version. The route may be established based on a shortest route using a cost function for each road segment between the origin and the destination, with the goal of minimizing the cost function for the shortest route. While some embodiments may find the shortest route between an origin and a destination, embodiments may optionally identify the fastest route or route that takes the least amount of time. In computing the fastest route, the expected traffic speeds along each road segment considered for the route may be used based on real-time data and optionally incorporating historical traffic speed data. In this way the cost function may be used to establish the route with the lowest time cost between the origin and the destination while considering the influence of traffic along each route.

Once a route is established between the START and TARGET, a sequential listing of XOR-Stable road link identifiers may be provided by the server to the client for the client to use as the route between the origin and the destination.

Server-Side Route Computation with Fishbone Penalties

While the aforementioned embodiment of route generation establishes the fastest time or the lowest cost route between the START and TARGET, embodiments described herein may also factor in deviations from the fastest or least costly route. A client requesting the route may want the traffic-aware fastest route from the server. However, the client may also be interested to understand, for each road along the route that would leave the route, herein referred to as the fishbone, how much more time would the alternative route take. With the client and server potentially operating on different map versions, it may not be feasible to use simple road link identifiers to encode the route as the road link identifiers need to be resolved on both map versions.

According to such an embodiment, a routing request from a client may include the origin or START encoded as the midpoint and z-level of the START_SEGMENT and the destination or TARGET encoded as the midpoint and z-level of the TARGET_SEGMENT. The client may also send the XOR-Stable identifiers of the START_SEGMENT and the TARGET_SEGMENT to the server in the route request. According to the embodiment described herein, the client may also send a number "N" of buckets for "fishbone penalties."

The routing server will use the provided START and TARGET to find the appropriate road links in the latest map version, and may tolerate a few meters of error in the midpoint and use the z-level for tie breaking as described above. The server may use the XOR-Stable identifiers of the START_SEGMENT and TARGET_SEGMENT to find the appropriate road links if there are multiple candidates for the START and/or the TARGET. The server may compute the route on the road network where segment-traversal costs are computed from real-time and historical traffic patterns to estimate current travel times. The routing server may then compute the fastest route between the START and TARGET using the latest map. Optionally, as described above, the server may calculate the lowest cost route, which may coincide with the fastest route. The identified route provided to the client may be established based, at least in part, on client preferences, such as avoiding tolls, avoiding highways, including High-Occupancy Vehicle (HOV) lanes, etc., as these preferences may impact the route selection.

For each road link in the route, the routing server may identify the XOR-Stable link identifiers. The server may then send the sequence of road link identifiers to the client as the server-generated route. For every road segment that leaves the server-provided route, a difference may be calculated between the server-provided route and a route including the segment that leaves the server-provided route. This is calculated as a penalty for leaving the server-provided route to the TARGET. Such deviations become the fishbone emanating from the server-provided route.

The segments in the fishbone may be bucketized into "N" buckets, B_0 to B_N. For the buckets i=0 ... N−1: add the road links from the fishbone into B_i with a penalty "D" in minutes where i<=D<i+1, with a delay between inclusive i and exclusive i+1 minutes. Essentially, each fishbone taken from the server-provided route increases the time penalty in minutes from the original server-provided route. For bucket B_N, the segments from the fishbone are added into B_N with a penalty D in minutes of N<=D, such that there is a delay of at least N. For each segment in any bucket, the routing server may look up the XOR-Stable identifiers. For each bucket B_0 ... B_N: the server sends all XOR-Stable identifiers of the segments in B_i to the client.

Embodiments described herein reduce conflicts between map versions whereby routes generated in a first version of a map cannot be properly correlated to routes in a second version of a map, thereby resulting in routing errors or the inability to generate a route. Further, by only sending intermediate points from the server to the client, bandwidth may be minimized while providing the client sufficient information to verify the fragments between intermediate points. Previous mechanisms for performing a similar task search for a matching link using a midpoint that involves a spatial, map-matching search for all links of a route which is computationally intensive. Using example embodiments described herein of route fragment fingerprints substantially reduces the bandwidth and processing requirements of the prior methods.

While the above-described embodiment finds a route between an origin and a destination, generating a sequential listing of XOR-Stable link identifiers, embodiments described herein may be used in routes of higher complexity. For example, routes may include waypoints that must be included along a route. In such an embodiment, in addition to a START and TARGET corresponding to an origin and a destination, one or more STOP locations could be received from a client. These waypoints may be designated as "STOP_i" with "i" denoting the number of the stop in the sequence of the route. According to the embodiment including waypoints, the START, TARGET, and all STOP_i could be encoded as the midpoint and the z-level of the START_SEGMENT, TARGET_SEGMENT, and all STOP_SEGMENT_i.

The example embodiment incorporating waypoints is similar to the embodiment described above lacking waypoints in that the map services provider 116 may compute a route that encompasses the waypoints. In this manner, the map services provider 116 may establish a route between START and every waypoint STOP_i, denoted as ROUTE_S_i. Routes may also be established between every STOP_i and TARGET, denoted as ROUTE_i_T. Finally, a route may be established between every STOP_i and STOP_j (where i does not equal j), denoted as ROUTE_i_j. This produces a plurality of routes between each point identified by the client.

The map services provider 116 or other routing server may then compute an optimal sequence of the intermediate stops or waypoints so that the overall travel distance or overall travel time from the START to the first stop in the sequence, between stops in the sequence, and from the last stop in sequence to TARGET is minimal. The computed ROUTEs are then used.

The route may be established between each pair of points (START, TARGET, and STOP_i) may be based on a shortest route using a cost function for each road segment between the origin and the destination, with the goal of minimizing the cost function for the shortest route. While some embodiments may find the shortest route between each pair of points, embodiments may optionally identify the fastest route or route that takes the least amount of time between points. In computing the fastest route, the expected traffic speeds along each road segment considered for the route may be used based on real-time data and optionally incorporating historical traffic speed data. In this way the cost function may be used to establish the route with the lowest time cost between points while considering the influence of traffic along each route.

The computed sequence, whether using shortest distance, shortest time, avoiding highways, or any other parameters used to generate the sequence, may be used to reorder the STOP_i waypoints so that STOP_i is the i-th stop in the sequence. This results in a sequence of routes that reaches each required waypoint or "tour". The tour may include the routes enumerated as ROUTE_S_1, ROUTE_S_2, ... , ROUTE_K_T to form the optimal tour. The sequence may be provided in the routing response to a client so the client understands the order of intermediate waypoints in the tour based on the client's selection of the waypoints.

The aforementioned example embodiments of the present disclosure describe definitive destinations and waypoints that are to be included in a route or tour route. However, according to some examples described herein, embodiments may include providing routes to potential destinations that are not yet established as definitive destinations. For example, a user may search on a client device for points-of-interest, such as restaurants, within a region. The results of the search may identify a number of potential destinations. While the user may have certain preferences regarding the search results, it may be desirable for the user to recognize the route and travel time to reach the various points-of-interest to help the user make a fully informed decision.

According to an example described herein, a user may conduct a search for a category of points-of-interest. A plurality of search results may be returned. The results may be limited in a number of ways. The search may be confined to a certain distance from the user, the search may be confined based on search parameters, and optionally, the search may be limited by a maximum number of results. This maximum number of results "K" may be established based on a number above which a map becomes crowded or a number above which a user is overwhelmed with options. Regardless, the number "K" may be the maximum number of results returned to a user.

The map services provider 116 of example embodiments may use the provided origin or START to find the appropriate segment on the latest version of the map. The map services provider may tolerate error of a few meters in map matching the START to a midpoint of a road segment for the START_SEGMENT and use the z-level to break ties among roads that may pass over or under one another. If the map services provider cannot match the START to a START_SEGMENT, a warning may be generated for a user that the user's present location does not correspond to a road segment of the latest version of the map, encouraging the user to move to a location that may be used for proper map matching to a START_SEGMENT.

Using the results of the search limited to "K" results, the map services provider 116 or another server may run an algorithm to find the shortest path to the search results. For example, the server may run Dijkstra's Algorithm starting at START_SEGMENT with modifications based on the present disclosure. Whenever the selected algorithm expands a segment S, the segment may be checked for points-of-interest of the respective category. If one or more of the points-of-interest of the requested category are found at segment S, the midpoint and z-level of the segment S may be stored as POI_i. The shortest path ROUTE_i from START_SEGMENT to that point-of-interest may be extracted from the Dijkstra's state. Once K points-of-interest are found, the algorithm may stop. While the Dijkstra Algorithm is described, any similar algorithm that yields K shortest path to K closest points-of-interest can be used. A benefit of using the modified Dijkstra algorithm is that it does not return the N bee-line-closest (e.g., as the crow flies shortest distance) point-of-interest, but the K travel-time-closest points-of-interest.

Each of the aforementioned potential routes to the different points-of-interest may be generated as described above as a sequence of XOR-Stable link identifiers between the START_SEGMENT and the respective point-of-interest. This list of identifiers provides a concise, low-bandwidth manner of communicating routes between the origin and the destination of each route.

Client-Side Route Computation and Decoding/Verification

As Described Above, a Server Such as a Map Services Provider 116 may Generate Routes as a sequential list of XOR-Stable road link identifiers provided to the client. Encoding routes as a sequential listing of link identifiers for clients to decode and interpret allows routes to be generated in a map version agnostic manner while conveying critical information to the client.

The client of example embodiments, which may be embodied as a mobile device 114 (e.g., cellular phone, tablet computer, navigation device, or the like) or as an in-vehicle navigational system may be in communication, via network 112, with a server such as map services provider 116 and processing server 102 thereof. The server provides the sequential list of XOR-Stable road link identifiers to the client. The client may make one or more roundtrips to the server in order to reconstruct routes provided by the server in the list of XOR-Stable link identifiers. The routes may include routes between an origin and a destination, routes between an origin and a destination with one or more waypoints, or routes between an origin and a plurality of destinations (e.g., points-of-interest). The maps on the server and the client potentially differ, such that mismatching can occur. If the client detects that a map difference is so severe that it cannot safely reconstruct a route the client can either request a map update or refuse the route and request a different route.

According to an example embodiment, a client may send a route request between an origin and a destination to a server, optionally including an XOR-Stable link identifier for a START_SEGMENT corresponding to the origin and a TARGET_SEGMENT corresponding to the destination. The client may receive, in response, a sequential listing of XOR-Stable link identifiers for road links that connect the origin to the destination. If the client detects that the provided sequence of XOR-Stable link identifiers cannot be properly correlated to a sequence of road links on the client-side map, such as if a link identifier in the client-side map is not XOR-Stable or does not result in a match with the server-provided link, the route may be refused.

If the route is refused, the client may request that the server recompute the route. In requesting that the server re-compute the route, the client may provide the server with "unmatchable link" that the client could not match to road links in the client-side map. The client may provide the unmatchable links using the server-provided XOR-Stable identifier to the server and request another route that avoids the unmatchable link. These may become "banned links" for the route generation. This process may be performed more than once, where the client may identify unmatchable links that it requests the server to ban on subsequent routes generated. Unmatchable links may be relatively uncommon, such that this process may not be frequently implemented. Map changes are generally somewhat trivial and only a very small amount of road updates will break connectivity, such as when a bridge is demolished or new, when highway interchanges change patterns, or when new roads are built. Further, the likelihood of unmatchable links being present in two sequential routes is considerably less likely and should not generally interfere with user satisfaction.

When a client receives a route represented by a sequential listing of link identifiers that can be properly map-matched at the client, the client can present the route or routes and begin navigation to the destination, point-of-interest, or waypoint. The server of example embodiments, such as map services provider 116, may provide the client, such as mobile device 114, with one or more routes that optimizes efficiency in distance or time, or according to other client-defined preferences. The server may provide one route when the client requests a route between an origin and a destination, a sequence of routes when the client requests one or more waypoints, where the sequence of routes is between an origin and a first waypoint, between the waypoints, and between the final waypoint and the destination. The server may optionally provide a plurality of routes, such as when a search is conducted for a plurality of points-of-interest, and a route is generated from the origin to each of the different points-of-interest.

Client-Side Route Reconstruction

Reconstruction of the route at the client may rely on XOR-Stable link identifiers preserving an XOR-Sum on the path. Any differences in the XOR-s Upon receiving the server-generated route in the form of a sequential listing of XOR-Stable link identifiers, the client may perform a reconstruction algorithm to decode the route received. In order to perform this algorithm, the client may perform the following:

Set RESULT to an empty list of road links
   Set CANDIDATES to contain a single element of the XOR-Stable link identifier of START_SEGMENT
   Call DECODE (ROUTE, CANDIDATES) to decode the route
   If the result was TRUE: Provide route guidance along the route
   If the result was FALSE: Reject the route According to the above-described algorithm, the client establishes if a route can be properly decoded from the sequential listing of XOR-Stable link identifiers. If a route can be decoded by the client based on the sequential listing of XOR-Stable link identifiers, then route guidance along the server-provided route may commence. If a route cannot be decoded, then the server-provided route is rejected. The client-side decoding sub routine may perform the following algorithm:

FIRST=the first element of the ROUTE
   If CANDIDATES contain FIRST
     Add the segment denoted by FIRST to RESULT
     Remove the first element from ROUTE
     Let CANDIDATES now contain the XOR-Stable link identifiers of all links that connect with FIRST
     RETURN DECODE (ROUTE, CANDIDATES) to decode the remainder of the route.
   Else if DECODE_MERGE (ROUTE, CANDIDATES) is true:
     RETURN TRUE
   Else if DECODE_SPLIT (ROUTE, CANDIDATES) is true:
     RETURN TRUE
   RETURN FALSE The client-side decoding sub routine detailed above identifies the first element or road link/segment from the route in the local map of the client. If the local map version includes an identifier that corresponds with the first element of the route, then that road link is matched and removed from the server-provided list of elements of the route. From the first road link, the list of elements in the sequential listing of XOR-Stable link identifiers that correspond to links that connect with the first are identified, and the decoding of the route continues as long as link identifiers provided by the server are found within the map version at the client. If a road link identifier of the route from the server is not found in the client map version, the DECODE algorithm enters sub-algorithms DECODE_MERGE and DECODE_SPLIT as necessary to determine if the link isn't found in the client-side map version due to road links merging or splitting, respectively.

Decoding the merging of road links occurs as illustrated in FIG. 3, where the old version of the map may include road link A, and the new map version includes road links B and C with the addition of node 306 and road link D. The DECODE_MERGE sub-algorithm is run to see if the first and second road link elements of the route can be merged to find the road link on the client-side version of the map by applying the XOR function to the first and second road link of the route, thus locally correlating the first and second road links of the route with a known road link in the local version of the map. It is noted that the "first and second road links of the route" does not necessarily include the START_SEGMENT as the DECODE algorithm removes road link elements from the sequential list as they are confirmed to the local client-side version of the map. In this way the DECODE algorithm proceeds through the sequential list to correlate each road link of the route with the local map version. The DECODE_MERGE sub-algorithm may proceed as follows:

FIRST, SECOND=the first and second road link elements of the ROUTE from the server
   Remove the first and second element from the ROUTE
   Add XOR (FIRST, SECOND) to the beginning of the ROUTE
   RETURN DECODE (ROUTE, CANDIDATES)

This process will identify a road link that was split into two road links, as illustrated in FIG. 3. The first and second road link elements of the route are used in an XOR function to replace the first and second road link elements of the route to then return to the DECODE algorithm above, where the client establishes if the XOR'd first and second road link elements are recognized on the client-side version of the map. If so, then the DECODE algorithm continues.

If the DECODE_MERGE sub-algorithm does not identify a road link in the client-side map version that was split into two road links of the server-side route, a second sub-algorithm may be performed to determine if the road link in the client-side map version was merged into another, consecutive road segment of the server-side route. The DECODE_SPLIT sub-algorithm may be run to establish if this occurred. This sub-routine checks if the first (i.e., next) road link element from the server provided ROUTE corresponds to two locally connected road link elements by enumerating the XOR-Stable link identifiers of the CANDIDATES and their connected links and applying the XOR function to them. The sub-algorithm proceeds as follows:

Initialize a new empty set CANDIDATES2
   For each CANDIDATE in CANDIDATES:
     For the XOR-Stable link identifier of each link that connects with CANDIDATE:
       Add XOR (CANDIDATE, ID) to CANDIDATES2
   RETURN DECODE (ROUTE, CANDIDATES2)

The aforementioned DECODE_SPLIT sub-algorithm uses the next candidate in the server provided route together with the subsequent road link element in the route in the XOR function to establish if those road links combined correspond to a single road link of the client. If so, the sub-algorithm has matched that portion of the route and returns to the DECODE algorithm to proceed with matching the next road link element of the server-provided route to the client-side map.

Client-Side Route Computation and Decoding/Verification with Fishbone Penalties

According to an example embodiment in which a route is requested by a client and they are interested to understand, for each road along the route that would leave the route, herein referred to as the fishbone, how much more time would the alternative route take. With the client and server potentially operating on different map versions and as noted above, it may not be feasible to use simple road link identifiers to encode the route as the road link identifiers need to be resolved on both map versions. The client may provide the number "N" to receive the fishbone as XOR-Stable link identifiers in buckets from zero to N and at least N minutes from the server. The routing server will respond with a sequential listing of XOR-Stable link identifiers that denote the traffic-aware fastest or lowest cost route in the server map. Further, when requesting a route including the fishbone penalties, the server may send buckets B_0 to B_N with XOR-Stable link identifiers from the server map.

The client may perform the decoding of the route as described above, initially setting RESULT to an empty list of segments and setting CANDIDATES to contain a single element of the XOR-Stable link identifier of the START_SEGMENT. The DECODE algorithm is then called using DECODE (ROUTE, CANDIDATES) as described above. When the result is a legitimate route, the route is then provided for navigational assistance or route guidance. If the result of the algorithm is an error, the route is rejected. The decoding of the route may include the merge and split sub-algorithms described above.

While the decoding of the route may be performed as described above without the fishbone penalty consideration, when employing the fishbone penalty consideration, additional processing of the route may be performed. To decode the fishbone, the following algorithm may be employed:

For every SEGMENT in the decoded ROUTE
    Add the XOR-Stable link identifiers of all connecting links off SEGMENT that are not part of the ROUTE to CANDIDATES
CANDIDATES now contains the set of all links that leave the ROUTE
For every XOR-Stable link identifier in every bucket B_0 . . . B_N:
    Try to find the link identifier locally leveraging the DECODE algorithm
    If RESULT=DECODE (ID, CANDIDATES) is not "ERROR"
        Add the corresponding segment of the first element in RESULT to FISHBONE mapping to the penalty its bucket refers to.

This algorithm for establishing the fishbone penalty described above essentially uses the decoding algorithm described above to establish the path of each fishbone bucket or branch away from the primary route. This enables the route guidance or navigational assistance to identify to a user the additional time penalties of deviations from the route. Road links deviating from the route may be annotated with the delay in time-of-arrival relative to the original route. This information may be presented to a user as they proceed along the route in a variety of manners. For example, an alternate route could be presented on a display to a user with the added time delay overlaid on the route. Optionally, the time penalty may be communicated to a user responsive to a natural language question. For example, a user may voice a request of "how much longer is it if I turn right now?" The route guidance may provide a textual or natural language response indicating that "it would take five minutes longer."

The additional information provided to a user based on the route deviations may provide a user with additional freedom to explore other routes to their destination while understanding the delay it will incur. This allows a user to weigh their options when deciding on alternative routes to their destinations with an informed result.

Using the aforementioned technique, the client recursively attempts to match a generated route to a server generated route based on XOR-Stable link identifiers established for road links between the origin and the destination. In doing this, the maps can be of different versions since the client attempts to match road links having XOR-Stable identifiers with road links that may be merged or split in a server-side map, but continue the XOR-Stable identifiers, such that the map versions need not match identically.

The result of embodiments described herein is a valid route in the client as the rules in the algorithm only traverse legal maneuvers. The algorithm minimizes client-server communication and thus bandwidth by only asking for details on pieces where XOR-Stable links cannot be correlated between map versions. The algorithm of example embodiments discovers regions that require map updates and can provide a fallback if the user does not want to update the map, or if they are in a region of poor signal reception whereby map updates are not practical.

The client-side decoding of routes may be substantially the same whether the client is decoding a single route from an origin to a destination, a plurality of routes between an origin and each of a plurality of points-of-interest, or if the route is a sequence of routes between waypoints.

FIG. 8 is a flowchart illustrative of a method according to example embodiments of the present invention. It will be understood that each block of the flowcharts and combination of blocks in the flowcharts may be implemented by various means, such as hardware, firmware, processor, circuitry, and/or other communication devices associated with execution of software including one or more computer program instructions. For example, one or more of the procedures described above may be embodied by computer program instructions. In this regard, the computer program instructions which embody the procedures described above may be stored by a memory device 204 of an apparatus employing an embodiment of the present invention and executed by a processor 202 of the apparatus. As will be appreciated, any such computer program instructions may be loaded onto a computer or other programmable apparatus (for example, hardware) to produce a machine, such that the resulting computer or other programmable apparatus implements the functions specified in the flowchart blocks. These computer program instructions may also be stored in a computer-readable memory that may direct a computer or other programmable apparatus to function in a particular manner, such that the instructions stored in the computer-readable memory produce an article of manufacture the execution of which implements the function specified in the flowchart blocks. The computer program instructions may also be loaded onto a computer or other programmable apparatus to cause a series of operations to be performed on the computer or other programmable apparatus to produce a computer-implemented process such that the instructions that execute on the computer or other programmable apparatus provide operations for implementing the functions specified in the flowchart blocks.

Accordingly, blocks of the flowcharts support combinations of means for performing the specified functions and combinations of operations for performing the specified functions for performing the specified functions. It will also be understood that one or more blocks of the flowcharts, and combinations of blocks in the flowcharts, can be implemented by special purpose hardware-based computer systems that perform the specified functions, or combinations of special purpose hardware and computer instructions.

FIG. 8 illustrates a flowchart depicting a method of generating a route based on codified road links and deciphering road links from differing versions of maps. An indication of a route request is provided at 410 between an origin and a destination. A list of road link identifiers is received in response to the route request at 420. A first road link identifier of the list is identified at 430. At 440, it is established whether the first road link of the list corresponds to a road link identifier of a network of road link identifiers. If there is correspondence, at 450, the first road link identifier is added to the route. At 460, that road link identifier is removed from the list since it is now part of the established route, and a determination is made as to whether the list includes any additional link identifiers. If it does, the method returns to 430 to identify that link. If the first road link identifier does not correspond to a road link identifier of the network of road link identifiers at 440, that indicates that the client cannot find the link on their version of the map. At 470, an XOR function is applied to the first road link identifier and a subsequent road link identifier in the list. If the XOR function applied to the first road link identifier and the subsequent road link identifier corresponds to a road link identifier in the network of road link identifiers, then correspondence between the route and the client's version of the map has been made at 480. The method returns to 460 where it is established if the route includes any additional links in the list. If not, at 490 the route is established within the network of road link identifiers since the method was able to correlate all links of the list with the link identifiers of the version of the map at the client.

In an example embodiment, an apparatus for performing the method of FIG. 8 above may comprise a processor (e.g., the processor 202) configured to perform some or each of the operations (410-490) described above. The processor may, for example, be configured to perform the operations (410-490) by performing hardware implemented logical functions and/or executing stored instructions for performing each of the operations. Alternatively, the apparatus may comprise means for performing each of the operations described above. In this regard, according to an example embodiment, examples of means for performing operations 410-490 may comprise, for example, the processor 202 and/or a device or circuit for executing instructions for processing information as described above.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

That which is claimed:

1. An apparatus comprising at least one processor and at least one memory including computer program code, the at least one memory and computer program code configured to, with the processor, cause the apparatus to at least:
   provide an indication of a route request between an origin and a destination;
   receive a list of road link identifiers in response to the route request;
   identify a first road link identifier in the list of road link identifiers;
   in response to the first road link identifier corresponding to a road link identifier of a network of road link identifiers, add the first road link identifier to a route;
   in response to the first road link identifier not corresponding to a road link identifier of the network of road link identifiers:
      apply an XOR function to the first road link identifier and a subsequent road link identifier in the list of road link identifiers;
      in response to the XOR function applied to the first road link identifier and the subsequent identifier corresponding with a road link identifier of the network of road link identifiers, add the road link identifier of the network of road link identifiers to the route;
   in response to the road link identifiers in the list of road link identifiers corresponding to road link identifiers of the network of road link identifiers directly or through the application of the XOR function, establish the route within a network of road links represented by the network of road link identifiers.

2. The apparatus of claim 1, wherein the apparatus is further caused to, in response to the first road link identifier not corresponding to a road link identifier of the network of road link identifiers:
   apply an XOR function to the first road link identifier and candidate road link identifiers of the network of road link identifiers;
   in response to the XOR function applied to the first road link identifier and candidate road link identifiers of the network of road link identifiers resulting in a correspondence between a first candidate road link identifier, the first road link identifier, and a second candidate road link identifier, establish correspondence between the first candidate road link identifier and the second candidate road link identifier with the first road link identifier.

3. The apparatus of claim 2, wherein in response to at least one of the road link identifiers in the list of road link identifiers not corresponding to a road link identifier of the network of road link identifiers directly or through the application of the XOR function, the apparatus is further caused to provide a rejection of the list of road link identifiers.

4. The apparatus of claim 3, wherein the apparatus is further caused to:
   provide an indication of a second route request between the origin and the destination, wherein the second route request includes an instruction to avoid the at least one of the road link identifiers in the list of road link identifiers not corresponding to a road link identifier of the network of road link identifiers directly or through the application of the XOR function.

5. The apparatus of claim 1, wherein causing the apparatus to establish the route within a network of road links represented by the network of road link identifiers comprises causing the apparatus to provide for route guidance along the route.

6. The apparatus of claim 1, wherein the route request between the origin and the destination comprises a request for the fastest route between the origin and the destination, wherein the route request further comprises alternate routes from the fastest route and an indication of a time penalty associated with the alternate routes.

7. The apparatus of claim 6, wherein causing the apparatus to establish the route within a network of road links represented by the network of road link identifiers comprises causing the apparatus to provide for route guidance along the route and identify the time penalty associated with the alternate routes.

8. A computer program product comprising at least one non-transitory computer-readable storage medium having computer-executable program code portions stored therein, the computer-executable program code portions comprising program code instructions configured to:
   provide an indication of a route request between an origin and a destination;
   receive a list of road link identifiers in response to the route request;
   identify a first road link identifier in the list of road link identifiers;
   in response to the first road link identifier corresponding to a road link identifier of a network of road link identifiers, add the first road link identifier to a route;
   in response to the first road link identifier not corresponding to a road link identifier of the network of road link identifiers:
      apply an XOR function to the first road link identifier and a subsequent road link identifier in the list of road link identifiers;
      in response to a result of the XOR function applied to the first road link identifier and the subsequent identifier corresponding with a road link identifier of the network of road link identifiers add the road link identifier of the network of road link identifiers to the route;
   in response to the road link identifiers in the sequential list of road link identifiers corresponding to road link identifiers of the network of road link identifiers directly or through the application of the XOR function, establish the route within a network of road links represented by the network of road link identifiers.

9. The computer program product of claim 8, further comprising program code instructions to, in response to the first road link identifier not corresponding to a road link identifier of a network of road link identifiers:
   apply an XOR function to the first road link identifier and candidate road link identifiers of the network of road link identifiers; and
   in response to the XOR function applied to the first road link identifier and candidate road link identifiers of the network of road link identifiers resulting in a correspondence between a first candidate road link identifier, the first road link identifier, and a second candidate road link identifier, establish correspondence between the first candidate road link identifier and the second candidate road link identifier with the first road link identifier.

10. The computer program product of claim 9, further comprising, in response to at least one of the road link identifiers in the list of road link identifiers not corresponding to a road link identifier of the network of road link identifiers directly or through the application of the XOR function, program code instructions to provide a rejection of the list of road link identifiers.

11. The computer program product of claim 10, further comprising program code instructions to:
   provide an indication of a second route request between the origin and the destination, wherein the second route request includes an instruction to avoid the at least one of the road link identifiers in the list of road link identifiers not corresponding to a road link identifier of the network of road link identifiers directly or through application of the XOR function.

12. The computer program product of claim 8, wherein the program code instructions to establish the route within the network of road links represented by the network of road link identifiers comprises program code instructions to provide for route guidance along the route.

13. The computer program product of claim 8, wherein the route request between the origin and the destination comprises a request for the fastest route between the origin and the destination, wherein the route request further comprises alternate routes from the fastest route and an indication of a time penalty associated with the alternate routes.

14. The computer program product of claim 13, wherein the program code instructions to establish the route within the network of road links represented by the network of road link identifiers comprises program code instructions to provide for route guidance along the route and identify the time penalty associated with the alternate routes.

15. A method comprising:
   providing an indication of a route request between an origin and a destination;
   receiving a list of road link identifiers in response to the route request;
   identifying a first road link identifier in the list of road link identifiers;
   in response to the first road link identifier corresponding to a road link identifier of a network of road link identifiers, adding the first road link identifier to a route;
   in response to the first road link identifier not corresponding to a road link identifier of a network of road link identifiers:
      applying an XOR function to the first road link identifier and a subsequent road link identifier in the list of road link identifiers;
      in response to a result the XOR function applied to the first road link identifier and the subsequent identifier corresponding with a road link identifier of the network of road link identifiers, adding the road link identifier of the network of road link identifiers to the route; and
   in response to the road link identifiers in the sequential list of road link identifiers corresponding to road link identifiers of the network of road link identifiers directly or through application of the XOR function, establishing the route within a network of road links represented by the network of road link identifiers.

16. The method of claim 15, further comprising, in response to the first road link identifier not corresponding to a road link identifier of a network of road link identifiers:
   applying an XOR function to the first road link identifier and candidate road link identifiers of the network of road link identifiers; and
   in response to the XOR function applied to the first road link identifier and candidate road link identifiers of the network of road link identifiers resulting in a correspondence between a first candidate road link identifier, the first road link identifier, and a second candidate road link identifier, establishing correspondence between the first candidate road link identifier and the second candidate road link identifier with the first road link identifier.

17. The method of claim 16, further comprising, in response to at least one of the road link identifiers in the list of road link identifiers not corresponding to a road link identifier of the network of road link identifiers directly or through the application of the XOR function, providing a rejection of the sequential list of road link identifiers.

18. The method of claim 17, further comprising:
providing an indication of a second route request between the origin and the destination, wherein the second route request includes an instruction to avoid the at least one of the road link identifiers in the list of road link identifiers not corresponding to a road link identifier of the network of road link identifiers directly or through application of the XOR function.

19. The method of claim 15, wherein establishing the route within the network of road links represented by the network of road link identifiers comprises providing for route guidance along the route.

20. The method of claim 15, wherein the route request between the origin and the destination comprises a request for the fastest route between the origin and the destination, wherein the route request further comprises alternate routes from the fastest route and an indication of a time penalty associated with the alternate routes.

* * * * *